(12) United States Patent
Hadji-Abdolhamid et al.

(10) Patent No.: US 8,446,229 B2
(45) Date of Patent: May 21, 2013

(54) SYSTEM AND METHOD FOR REDUCED AREA TUNABLE CAPACITORS

(75) Inventors: Amir Hadji-Abdolhamid, Aliso Viejo, CA (US); Hooman Darabi, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 665 days.

(21) Appl. No.: 12/546,397

(22) Filed: Aug. 24, 2009

(65) Prior Publication Data

US 2011/0025436 A1 Feb. 3, 2011

Related U.S. Application Data

(60) Provisional application No. 61/230,503, filed on Jul. 31, 2009.

(51) Int. Cl.
*H03H 11/00* (2006.01)
*H01G 5/00* (2006.01)

(52) U.S. Cl.
USPC .......................................... 333/17.1; 333/174

(58) Field of Classification Search
USPC ...................... 334/55, 78; 333/174, 17.1, 171
See application file for complete search history.

(56) References Cited

U.S. PATENT DOCUMENTS

| | | | | |
|---|---|---|---|---|
| 7,855,610 | B2 * | 12/2010 | Taghivand et al. | 331/167 |
| 8,130,053 | B2 * | 3/2012 | Mu | 333/17.1 |
| 2009/0134949 | A1 * | 5/2009 | He | 333/17.3 |
| 2010/0039194 | A1 * | 2/2010 | Darabi et al. | 334/55 |

* cited by examiner

*Primary Examiner* — Dean O Takaoka
*Assistant Examiner* — Alan Wong
(74) *Attorney, Agent, or Firm* — Sterne, Kessler, Goldstein & Fox P.L.L.C.

(57) ABSTRACT

Embodiments of a capacitive tuning system implementing a tunable capacitive array are presented herein. The tunable capacitive array includes both scaled coarse capacitors and one or more fine capacitors. The one or more fine capacitors advantageously reduce a differential nonlinearity associated with the scaled coarse capacitors. The use of fine capacitors limits additional area requirements in an integrated circuit implementation, while improving the accuracy of the capacitive tuning system.

19 Claims, 13 Drawing Sheets

(Tunable Capacitive Array)

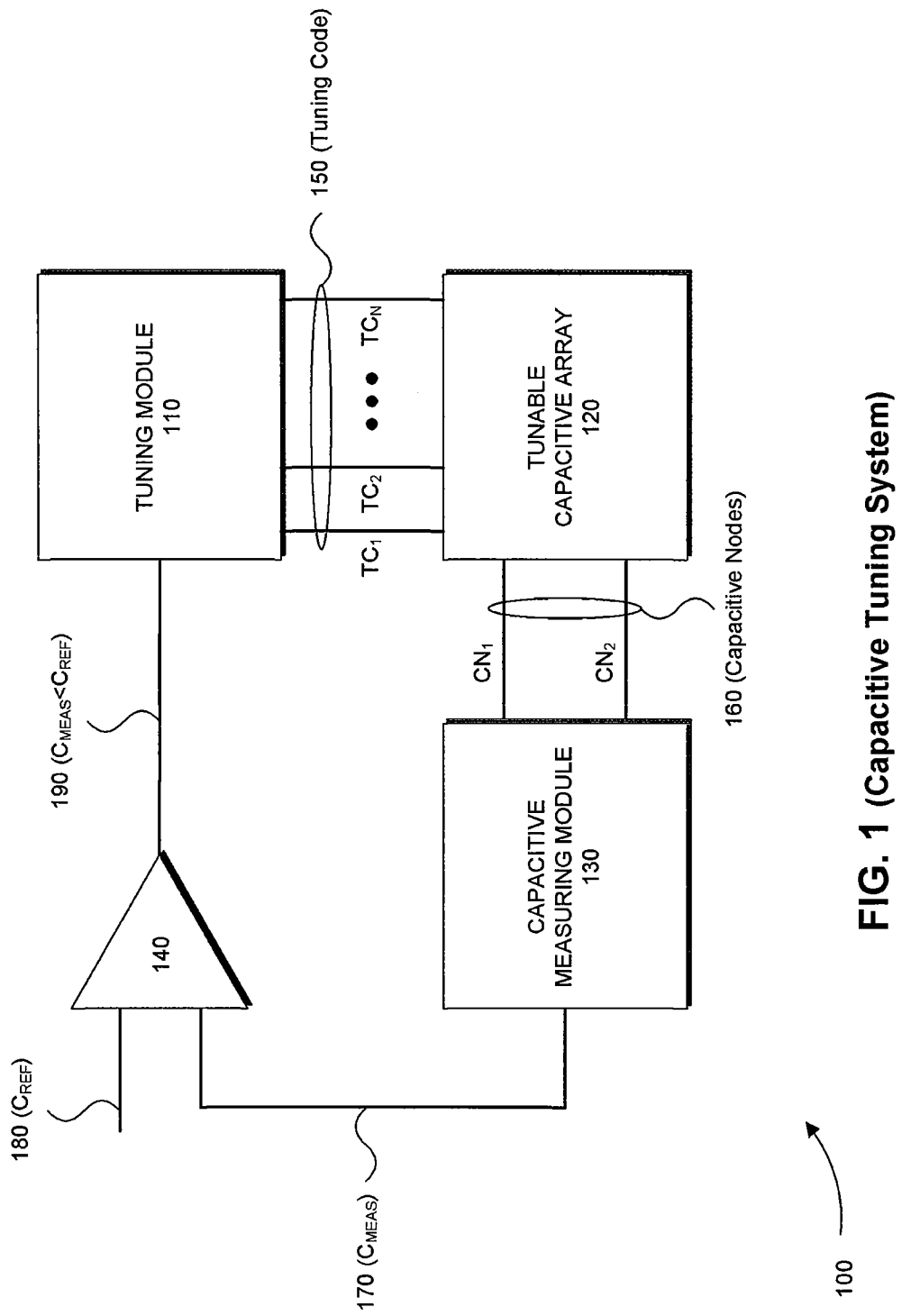
FIG. 1 (Capacitive Tuning System)

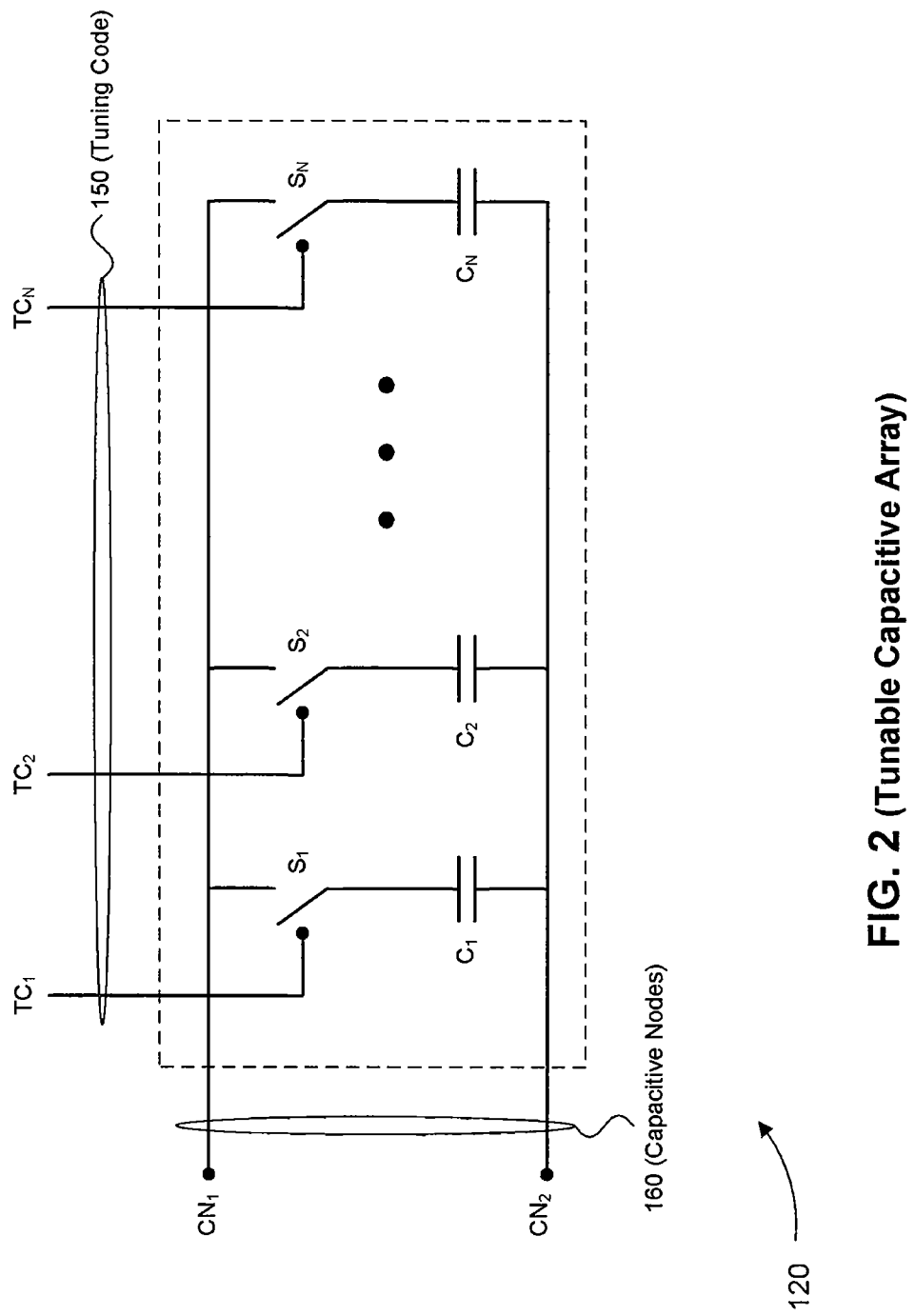
FIG. 2 (Tunable Capacitive Array)

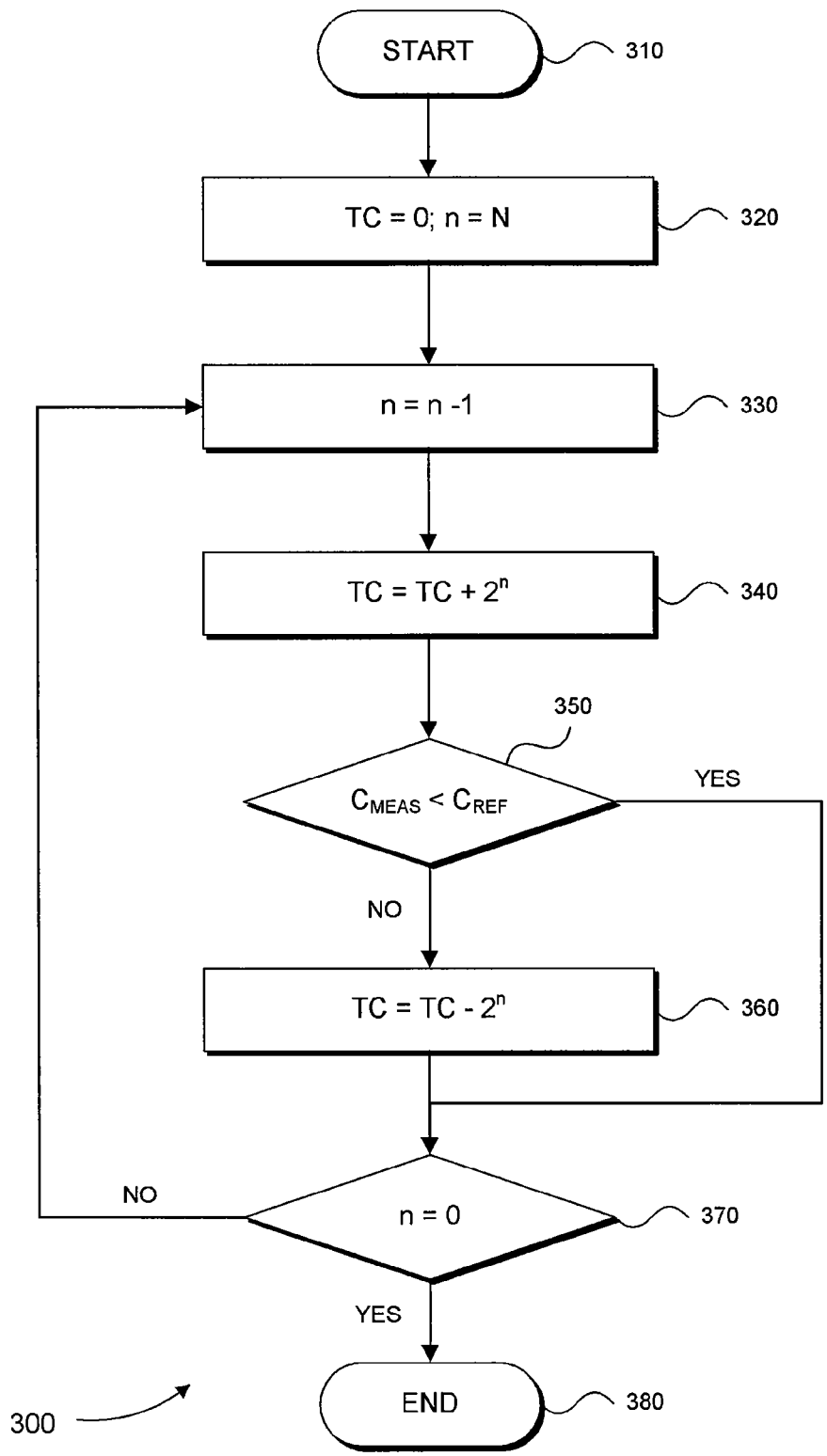
FIG. 3 (Tuning Method)

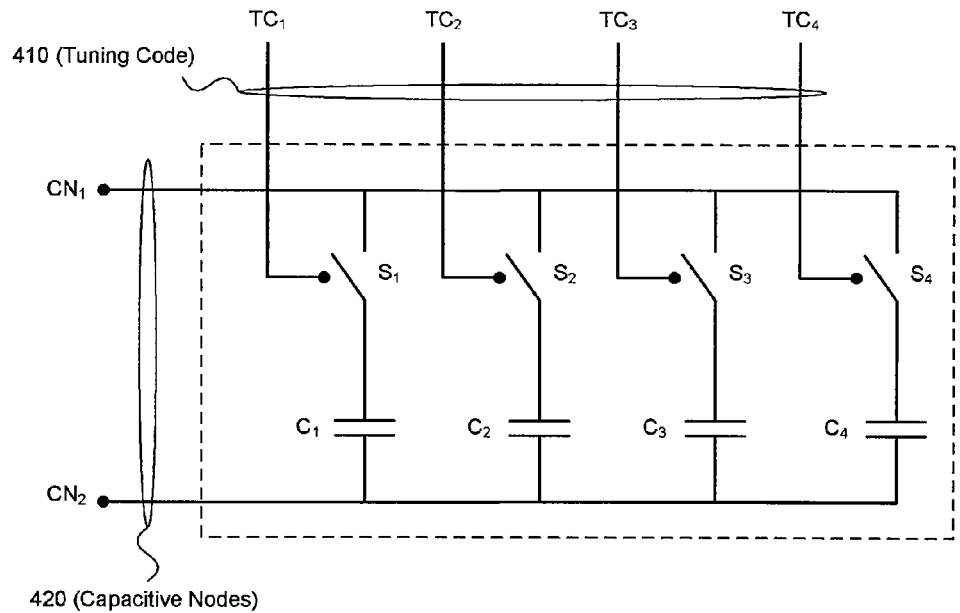
FIG. 4 (4-Bit Tunable Capacitive Array)
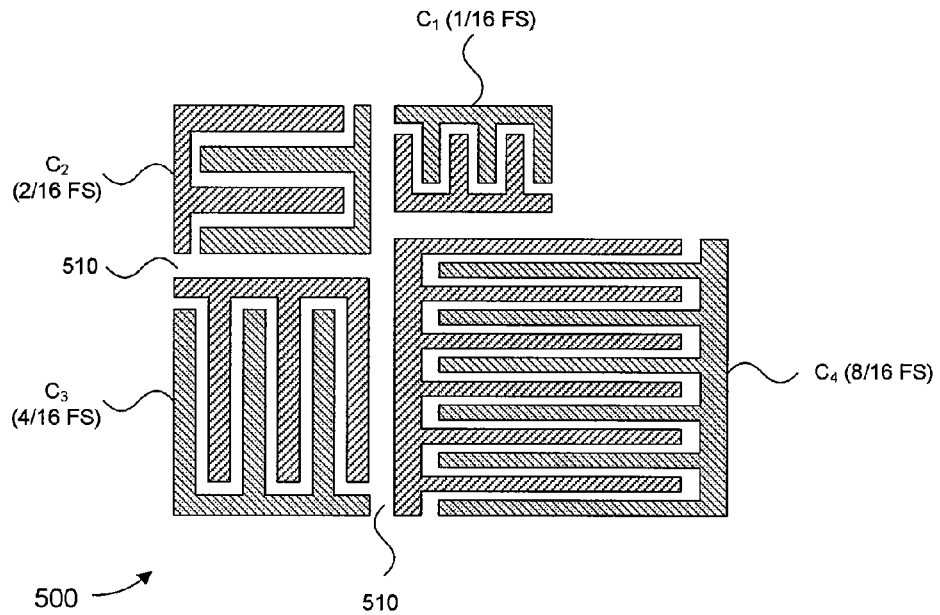
FIG. 5 (IC Capacitor Layout)

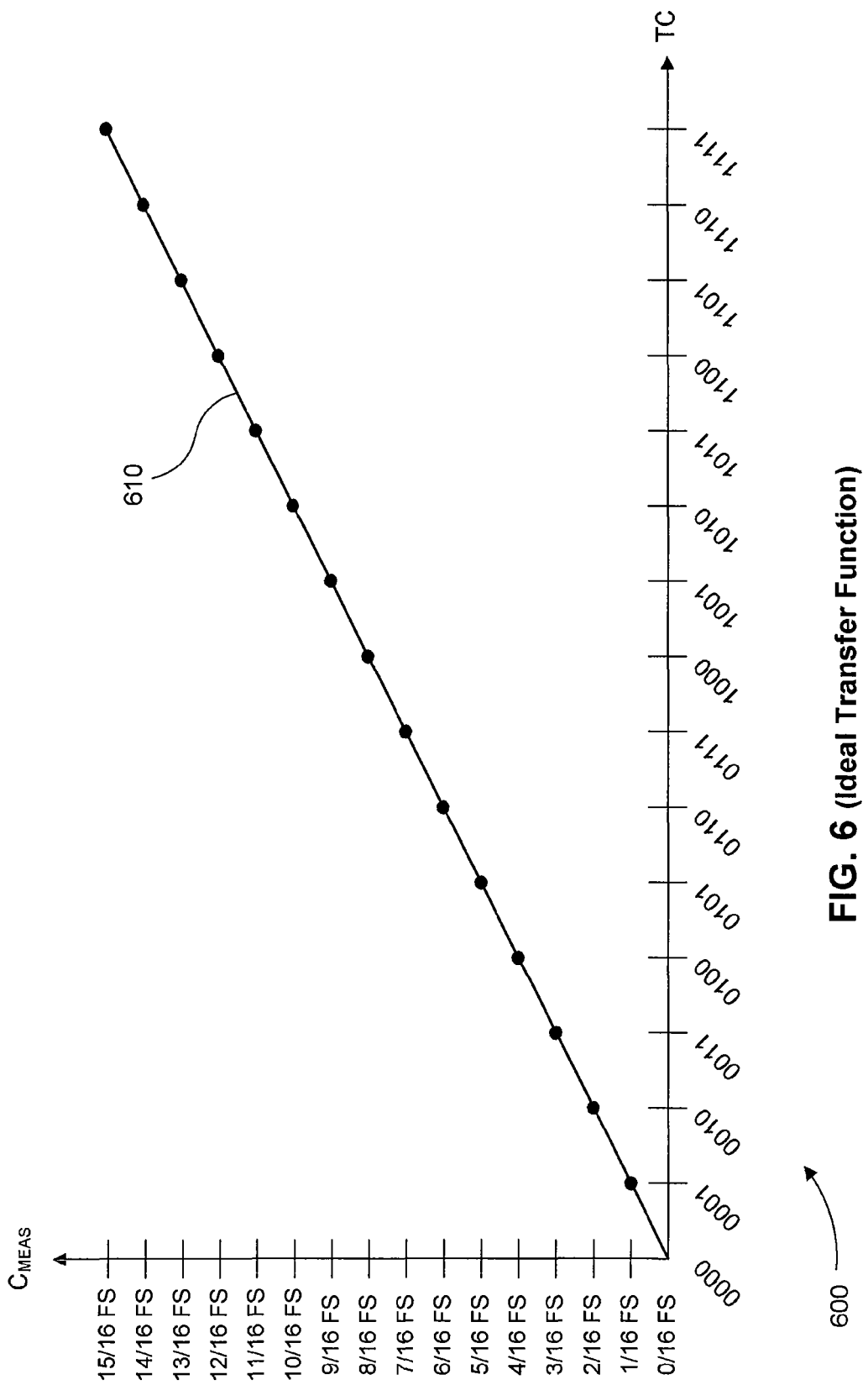
FIG. 6 (Ideal Transfer Function)

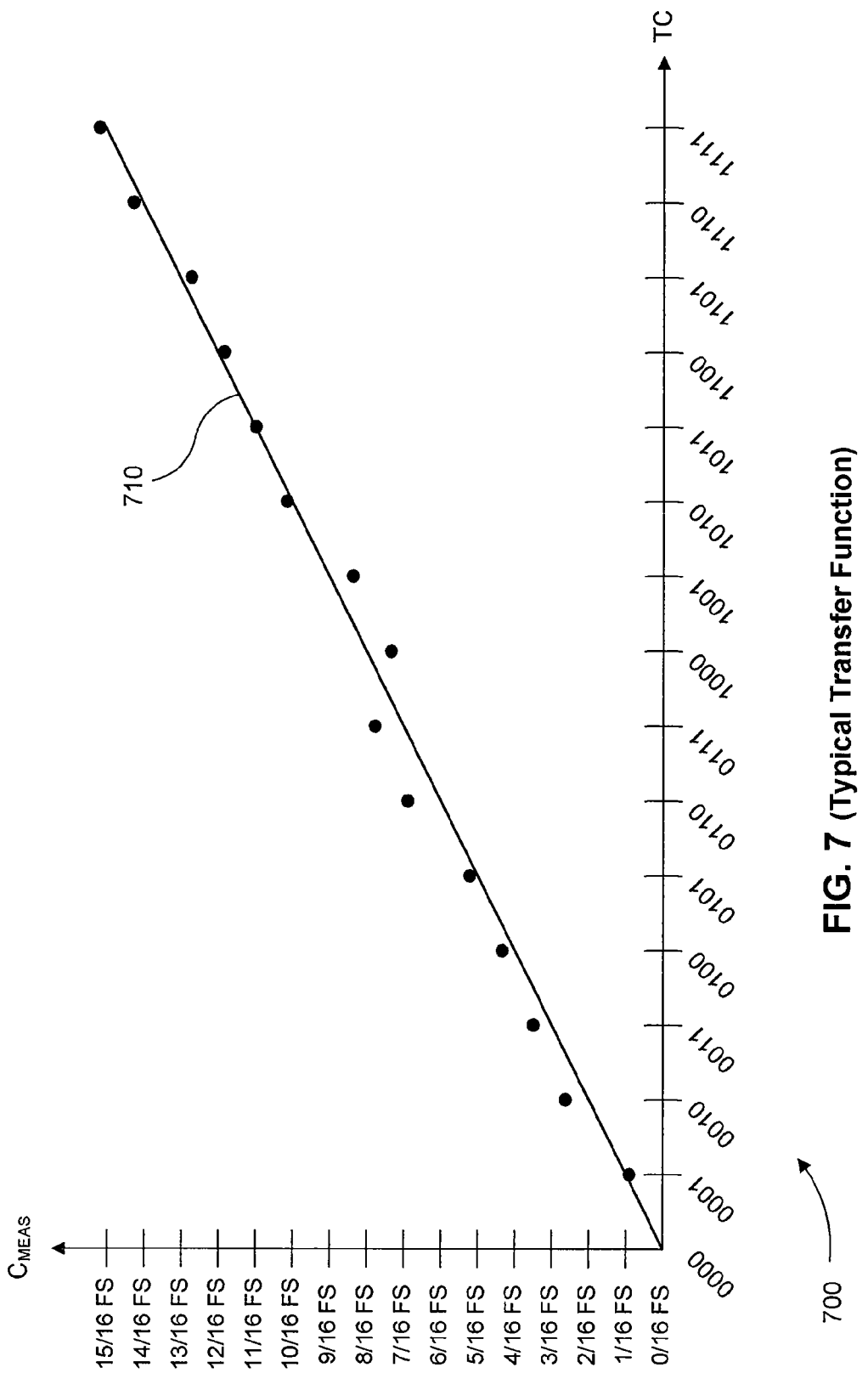
FIG. 7 (Typical Transfer Function)

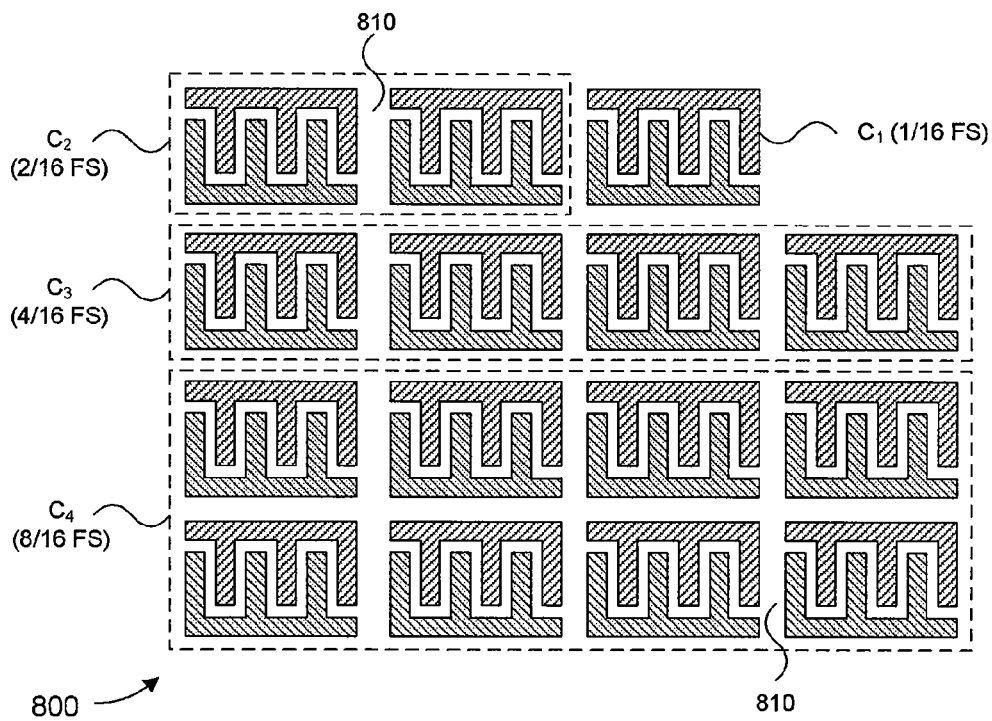
FIG. 8 (Conventional IC Capacitor Layout)
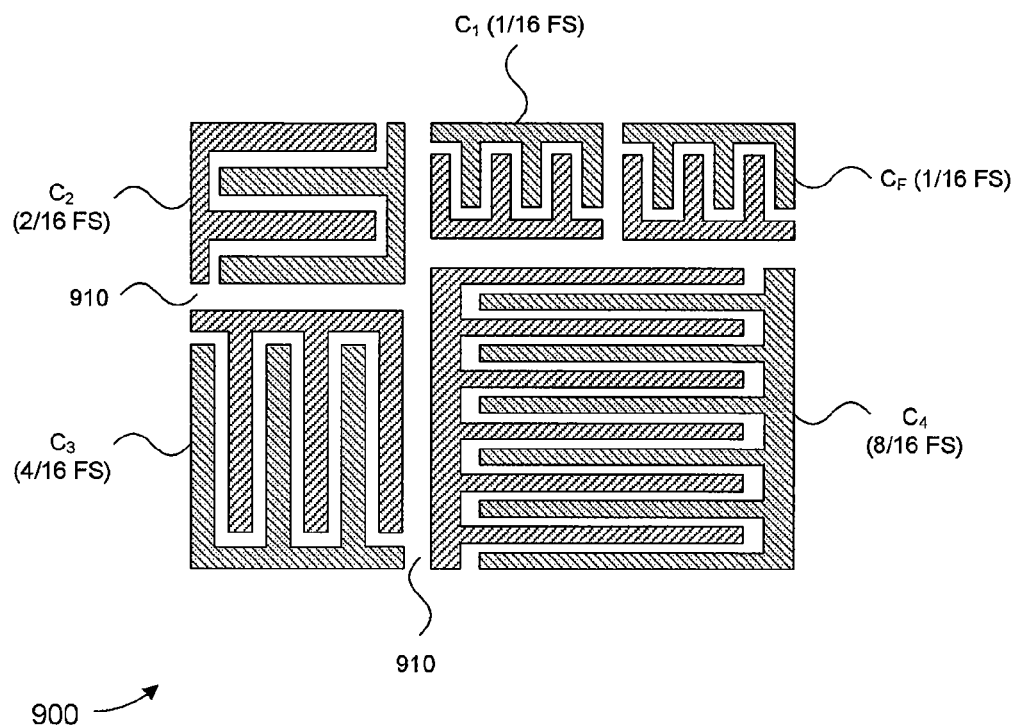
FIG. 9 (Coarse/Fine IC Capacitor Layout)

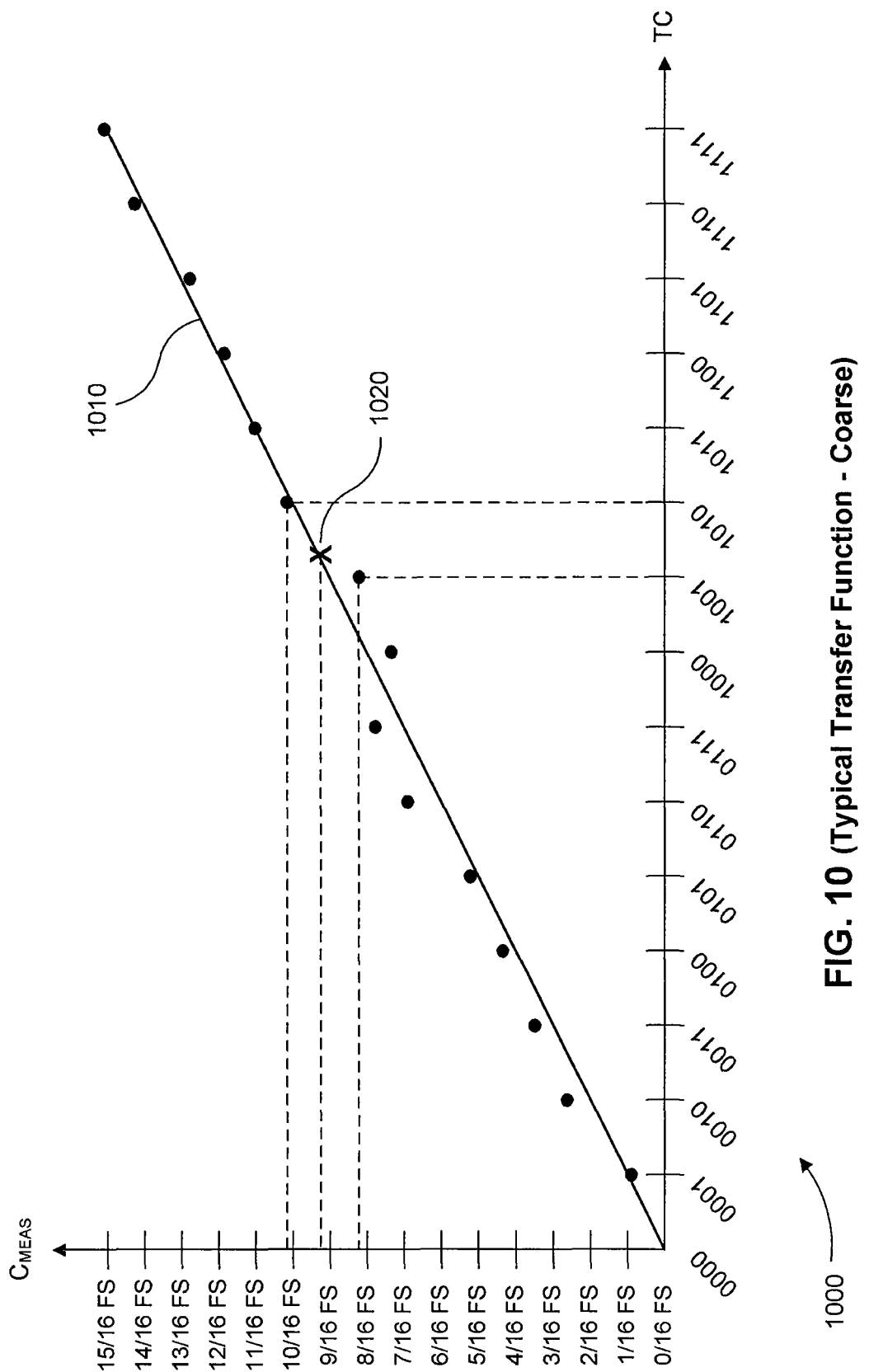
FIG. 10 (Typical Transfer Function - Coarse)

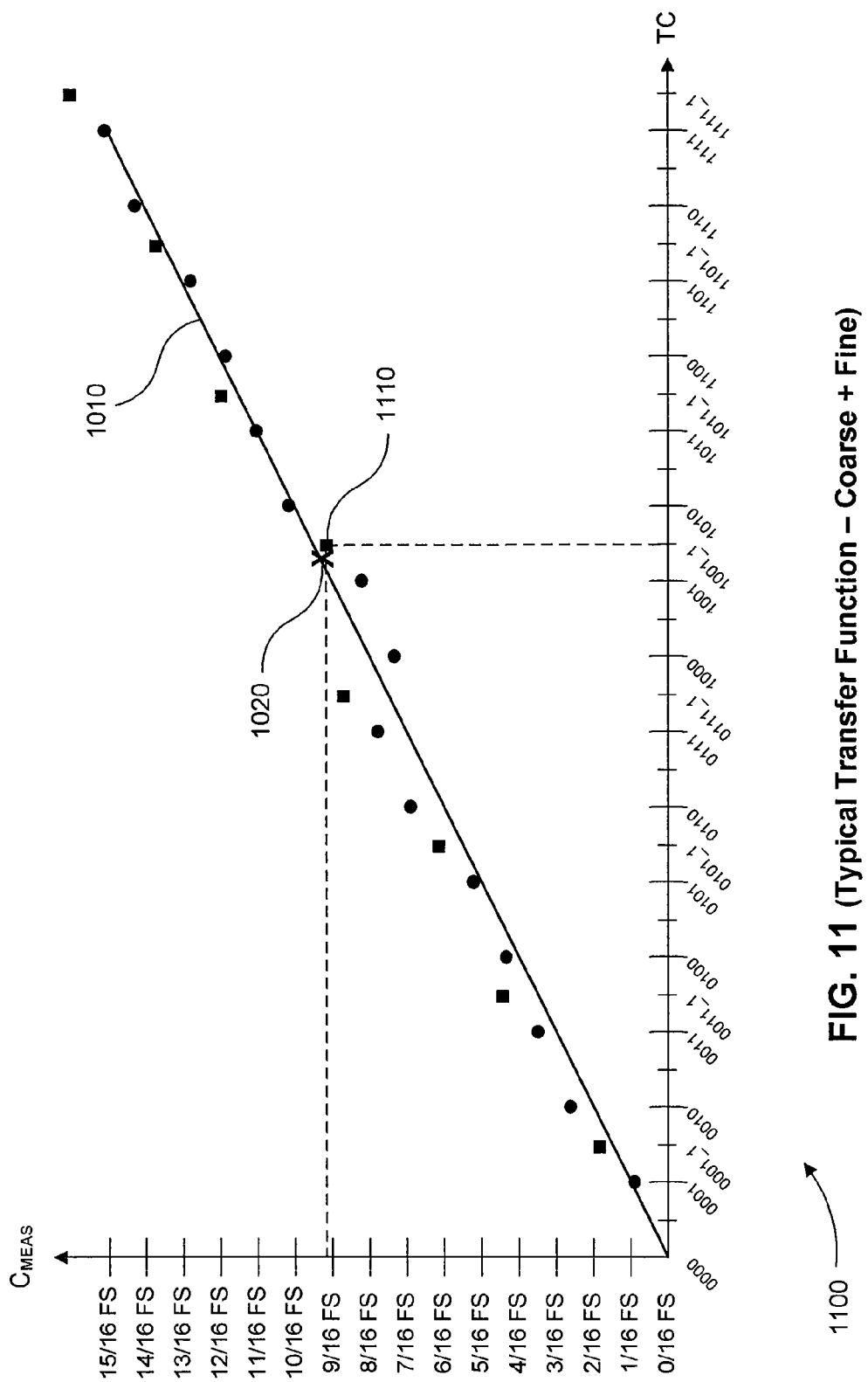
FIG. 11 (Typical Transfer Function – Coarse + Fine)

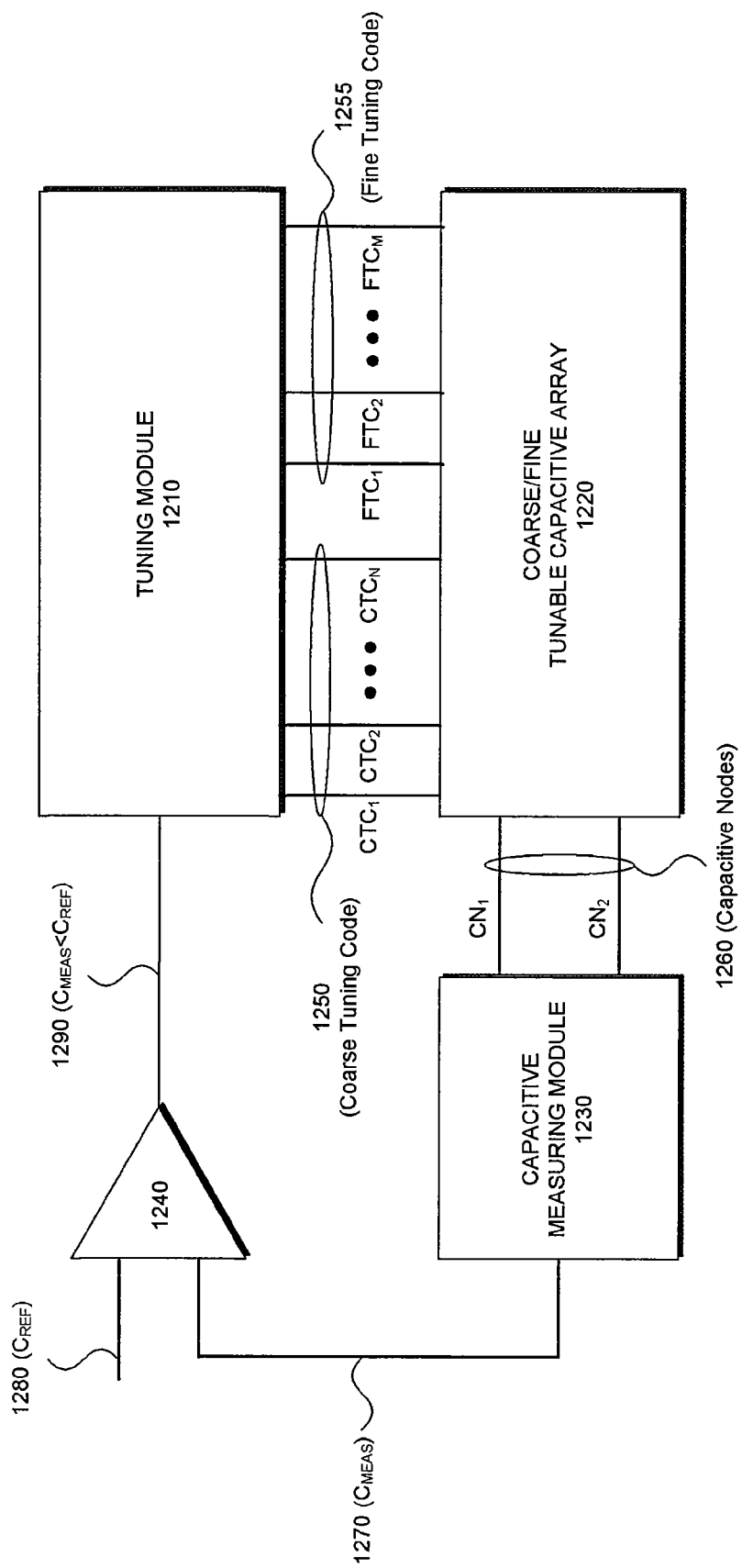
FIG. 12 (Coarse/Fine Capacitive Tuning System)

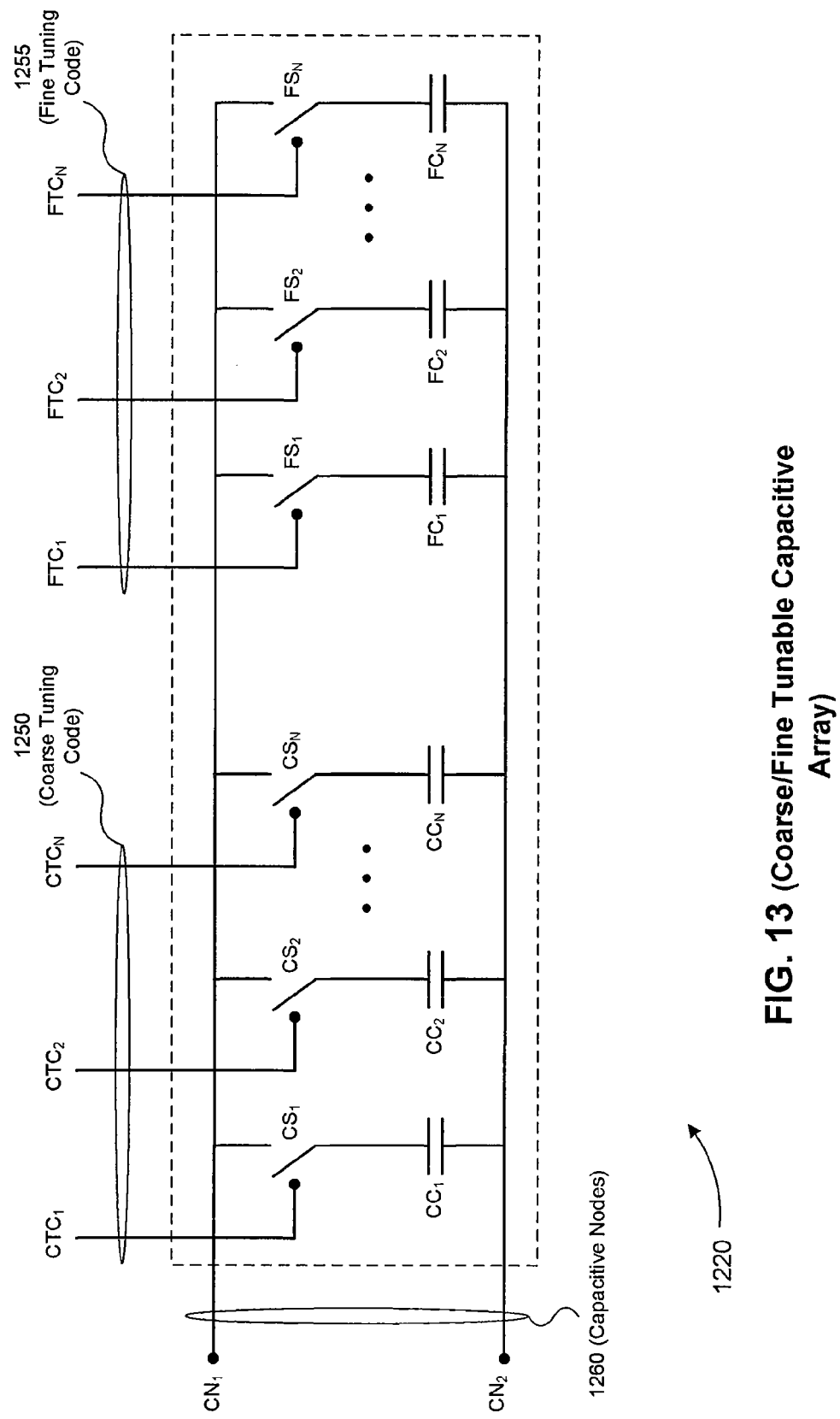
FIG. 13 (Coarse/Fine Tunable Capacitive Array)

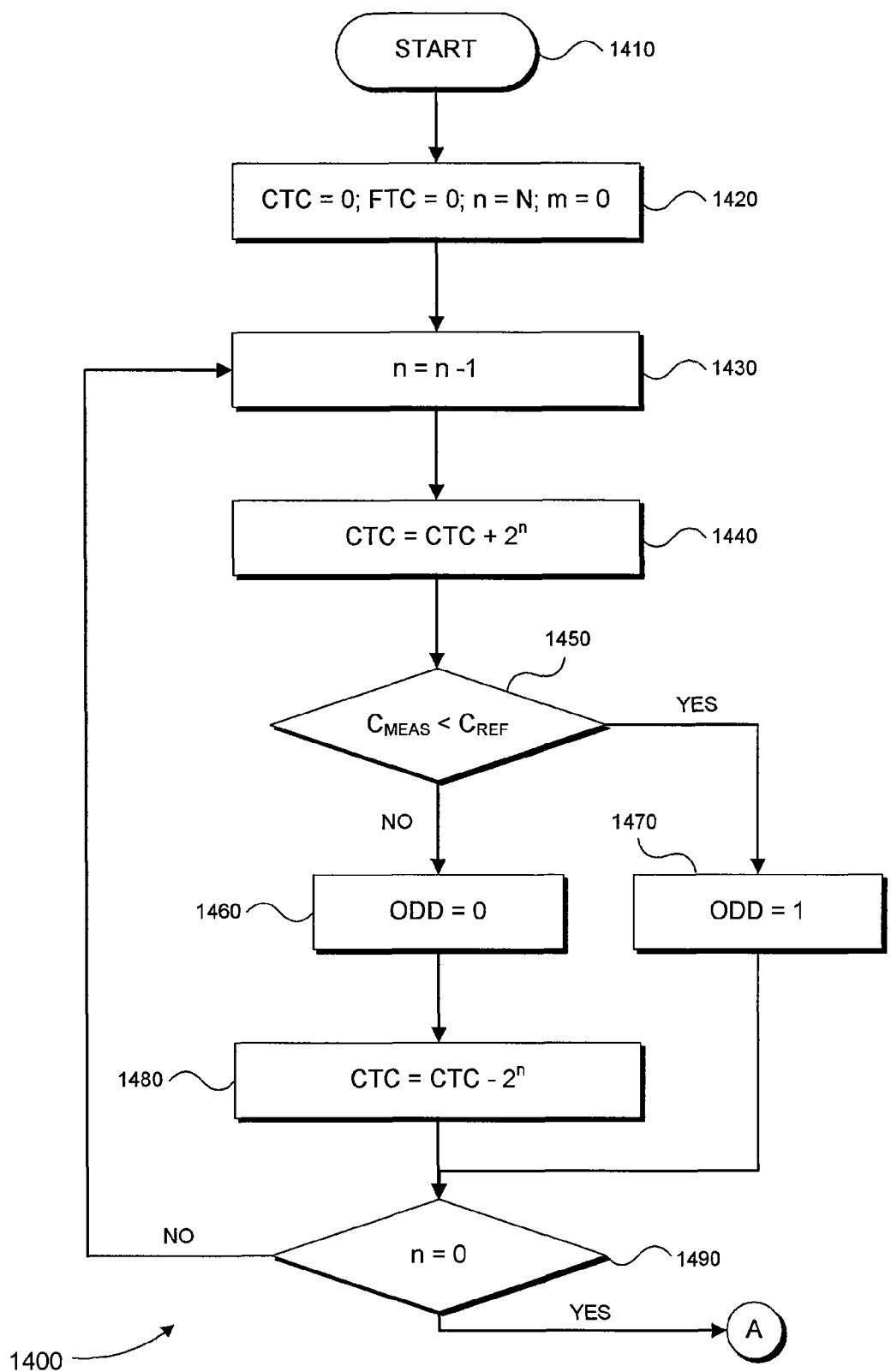
FIG. 14 (Modified Tuning Method - Coarse)

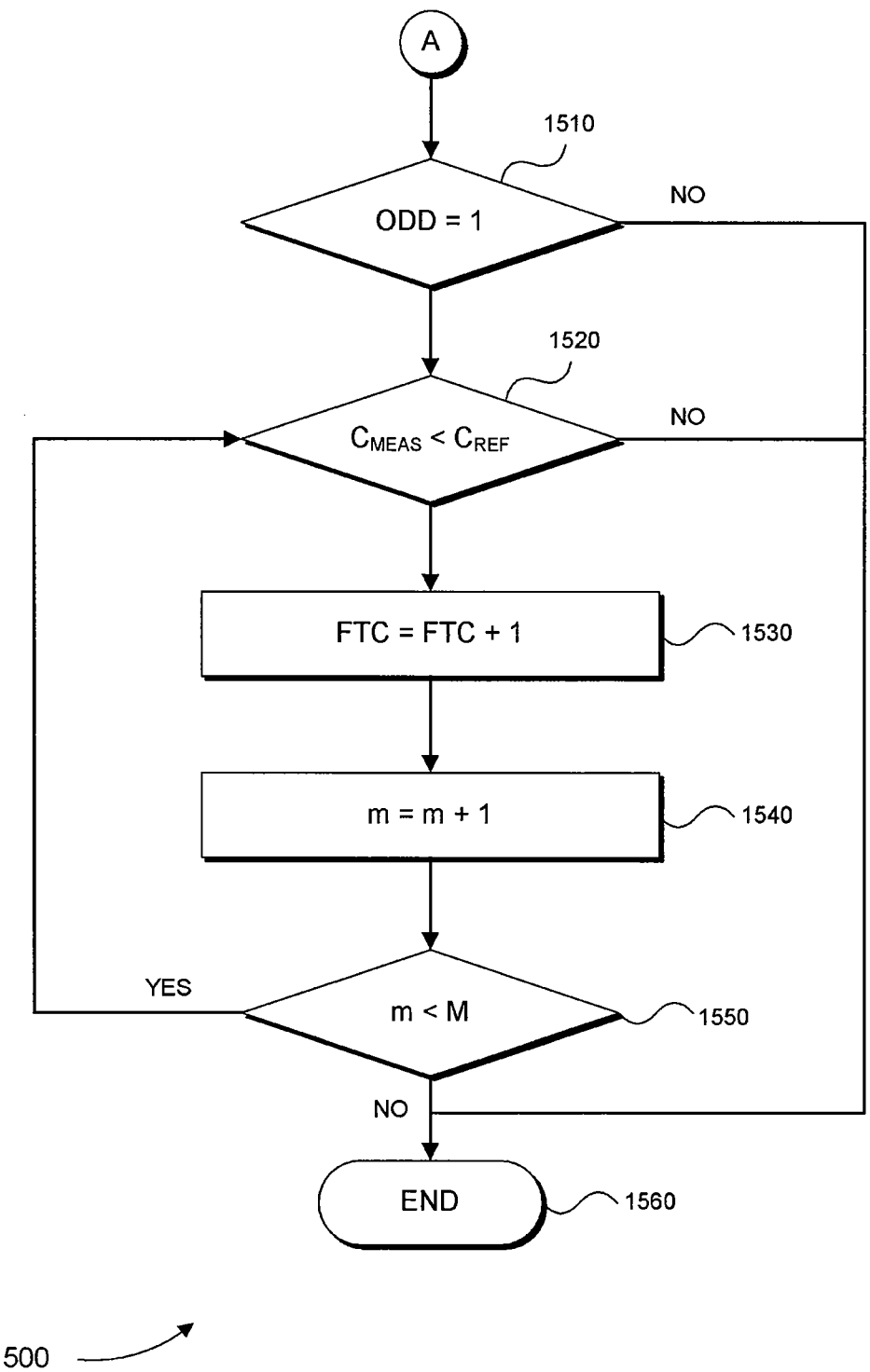
FIG. 15 (Modified Tuning Method - Fine)

SYSTEM AND METHOD FOR REDUCED AREA TUNABLE CAPACITORS

CROSS REFERENCE TO RELATED APPLICATIONS

The present application claims the benefit of U.S. Provisional Patent Application No. 61/230,503, filed Jul. 31, 2009, entitled "System and Method for Reduced Area Tunable Capacitors," which is incorporated herein by reference in its entirety.

FIELD OF THE INVENTION

This application relates generally to capacitors and, more specifically, to tunable capacitors.

BACKGROUND

When implementing a capacitive structure in an integrated circuit (IC), two design criteria are often at the forefront of consideration; namely, accuracy and area. Accuracy of a capacitive structure indicates the degree to which its measured capacitance matches its expected capacitance. Depending on the application in which the capacitive structure is to be implemented, accuracy can be more or less important. For example, analog filters and voltage controlled oscillators (VCOs) are two exemplary applications that often require capacitors which are relatively accurate.

IC implementations of capacitive structures are particularly vulnerable to accuracy issues. Specifically, process variations, associated with the production of ICs, limit the accuracy that can be guaranteed for typical capacitive structures. Tunable Capacitor can be used to compensate for both capacitor variation and other component variations such as resistor (R) variation in RC constant circuits. However, the capacitive structures used to construct tunable capacitors are similarly vulnerable to accuracy issues. Conventional solutions attempt to provide a higher accuracy for a particular tunable capacitor at the expense of area—the second design consideration often contemplated in the implementation of a capacitor within an IC. However, because IC capacitive structures generally provide low capacitive density, any further increase in area is prohibitive.

Therefore, there exists a need for a system and method that provides for an accurate tunable capacitance within an IC, while limiting any additional area requirements.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 1 illustrates a capacitive tuning system, according to embodiments of the present invention.

FIG. 2 illustrates a tunable capacitive array, according to embodiments of the present invention.

FIG. 3 illustrates an exemplary tuning method for the capacitive tuning system of FIG. 1, according to embodiments of the present invention.

FIG. 4 illustrates a 4-bit tunable capacitive array, according to embodiments of the present invention.

FIG. 5 illustrates an exemplary IC capacitor array layout for the 4-bit tunable capacitive array illustrated in FIG. 4.

FIG. 6 illustrates a plot of an ideal transfer function for the capacitive array layout of FIG. 5.

FIG. 7 illustrates a plot of a typical transfer function for the capacitive array layout of FIG. 5.

FIG. 8 illustrates a conventional IC capacitor array layout.

FIG. 9 illustrates a coarse/fine IC capacitor array layout, according to embodiments of the present invention.

FIG. 10 illustrates a plot of a typical transfer function for the coarse portion of the coarse/fine IC capacitor array layout of FIG. 9, according to embodiments of the present invention.

FIG. 11 illustrates a plot of a typical transfer function for both the coarse and fine portions of the coarse/fine IC capacitor array layout of FIG. 9, according to embodiments of the present invention.

FIG. 12 illustrates an exemplary coarse/fine capacitive tuning system, according to embodiments of the present invention.

FIG. 13 illustrates an exemplary coarse/fine tunable capacitive array, according to embodiments of the present invention.

FIG. 14 illustrates a modified tuning method for tuning a coarse portion of a coarse/fine IC capacitor array layout, according to embodiments of the present invention.

FIG. 15 illustrates a modified tuning method for tuning a fine portion of a coarse/fine IC capacitor array layout, according to embodiments of the present invention.

The present invention will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the invention. However, it will be apparent to those skilled in the art that the invention, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

1. OVERVIEW OF A CAPACITIVE TUNING SYSTEM

FIG. 1 illustrates a capacitive tuning system 100, according to embodiments of the present invention. Capacitive tuning system 100 includes a tuning module 110, a tunable capacitive array 120, a capacitive measuring module 130, and a comparator 140. Capacitive tuning system 100 can be used within an IC to calibrate a tunable capacitive array, such as tunable capacitive array 120, to provide a desired capacitance. In general, tunable capacitive arrays are often used in ICs to provide higher-levels of accuracy for IC capacitive structures.

Tuning module 110 is coupled to tunable capacitive array 120 via tuning code 150, which includes digital bits $TC_1$-$TC_N$. The value of tuning code 150 is adjusted by tuning module 110 to vary the capacitance provided by tunable capacitive array 120. The capacitance provided by tunable capacitive array 120 is provided across capacitive nodes 160, which includes nodes $CN_1$ and $CN_2$. In an embodiment, tunable capacitive array 120 is designed to provide increasing values of capacitance across capacitive nodes 160 for increasing values of tuning code 150.

Capacitive measuring module 130 is coupled to tunable capacitive array 120 via capacitive nodes 160. Capacitive measuring module 130 is configured to measure the actual capacitance provided by tunable capacitive array 120 across capacitive nodes 160. The measured capacitance ($C_{MEAS}$) 170 is provided at an output of capacitive measuring module 130 to comparator 140. In an embodiment, measured capacitance 170 is provided as a voltage signal.

Comparator 140 receives measured capacitance 170 at an input and compares measured capacitance 170 to a reference capacitance value ($C_{REF}$) 180. In an embodiment, comparator 140 determines if measured capacitance 170 is less than reference capacitance value 180. In general, reference capacitance value 180 represents a desired capacitance value. Tuning module 110 can receive the comparison result 190 to adjust the capacitance provided by tunable capacitive array 120 to better match reference capacitance value 180. Specifically, if comparison result 190 indicates that measured capacitance 170 is less than reference capacitance value 180, tuning code 150 can be increased to adjust tunable capacitive array 120 to provide a larger capacitance. If comparison result 190 indicates that measured capacitance 170 is greater than reference capacitance value 180, tuning code 150 can be decreased to adjust tunable capacitive array 120 to provide a smaller capacitance. In this way, capacitive tuning system 100 can determine a tuning code that provides a capacitance, across capacitive nodes 160, which most accurately matches reference capacitance value 180. It should be noted that any desired tuning method can be implemented within tuning module 110 for adjusting tuning code 150 based on comparison result 190. One exemplary tuning method is described in detail below in regard to FIG. 3.

FIG. 2 illustrates an exemplary implementation of tunable capacitive array 120, according to embodiments of the present invention. Tunable capacitive array 120 includes switches $S_1$-$S_N$ and scaled capacitors $C_1$-$C_N$.

Scaled capacitors $C_1$-$C_N$ are coupled/decoupled across capacitive nodes 160 by switches $S_1$-$S_N$. For example, switch $S_1$ couples/decouples capacitor $C_1$ across capacitive nodes 160. Specifically, if switch $S_1$ is closed, capacitor $C_1$ is coupled across capacitive nodes 160, and if switch $S_1$ is open, capacitor $C_1$ is decoupled across capacitive nodes 160.

In an embodiment, scaled capacitors $C_1$-$C_N$ increase in capacitance from capacitor $C_1$ to $C_N$ in a binary fashion; that is, the expected capacitance of each scaled capacitor $C_1$-$C_N$ doubles in relation to the capacitance that it immediately succeeds. For example, assuming capacitance $C_1$ is the base or smallest capacitance of scaled capacitors $C_1$-$C_N$, $C_2$ has an expected capacitance twice that of capacitor $C_1$. Similarly, the expected capacitance of capacitor $C_3$ is twice that of capacitor $C_2$. This pattern continues all the way up to capacitor $C_N$. Binary scaling of capacitors $C_1$-$C_N$ provides for $2^N$ different expected capacitance values that can be provided across capacitive nodes 160. Each of the $2^N$ different expected capacitance values corresponds to a different on/off configuration of switches $S_1$-$S_N$.

As further illustrated in FIG. 2, each switch $S_1$-$S_N$ is controlled by a respective bit of tuning code 150. Specifically, switch $S_1$ is controlled by the least significant bit, $TC_1$, of tuning code 150, switch $S_2$ is controlled by the second least significant bit, $TC_2$, of tuning code 150, and, continuing this pattern all the way through, switch $S_N$ is controlled by the most significant bit, $TC_N$, of tuning code 150. This particular coupling of tuning code 150 to switches $S_1$-$S_N$ allows for the expected capacitance, provided by tunable capacitive array 120 across capacitive nodes 160, to increase and decrease with the value of tuning code 150. In other words, as tuning code 150 increases, the expected capacitance provided by tunable capacitive array 120 increases and as tuning code 150 decreases, the expected capacitance provided by tunable capacitive array 120 decreases.

FIG. 3 illustrates an exemplary tuning method 300 that can be implemented by tuning module 110 of FIG. 1, according to embodiments of the present invention. Tuning method 300 is configured to perform a binary search over the values of tuning code 150 to determine the specific value of tuning code 150 that results in measured capacitance 170 being as closely matched as possible to reference capacitance 180.

The binary search is performed by starting with the median value of tuning code 150 and comparing measured capacitance 170 with reference capacitance 180. Based on the comparison result, half of the values associated with tuning code 150 can be disregarded. Specifically, if measured capacitance 170 is less than reference capacitance 180, the lower half of the values associated with tuning code 150 can be disregarded and searched no further. This is simply because if the median value of tuning code 150 results in a measured capacitance 170 that is less than reference capacitance 180, all values of tuning code 150 below the median value of tuning code 150 will similarly result in (or are expected to result in) a measured capacitance 170 that is less than reference capacitance 180. In the alternative, if measured capacitance 170 is greater than reference capacitance 180, the upper half of the values associated with tuning code 150 can be disregarded and searched no further. The process of selecting the median value of tuning code 150 and disregarding half of the values associated with tuning code 150 can be repeated for the remaining values of tuning code 150 until the value of tuning code 150 that results in measured capacitance 170 being as closely matched as possible to reference capacitance 180 is found. Tuning method 300 is described in further detail below with reference to FIG. 3.

Tuning method 300 starts at step 310 and immediately proceeds to step 320. At step 320 the value of tuning code 150, denoted by TC in FIG. 3, is initialized to 0 and variable n is initialized to the integer value N, which is equal to the number of digital bits used to represent tuning code 150. For explanation purposes, N will be assumed to be equal to 4, resulting in $2^4$ or 16 possible values of tuning code 150. The variable n is used throughout the execution of method 300 to iterate through the values represented by each bit of tuning code 150 (i.e., 8, 4, 2, and 1). After initialization at step 320, tuning method 300 proceeds to step 330.

At step 330, the value of n is decremented by 1 and tuning method 300 proceeds to step 340. At step 340, the current value of tuning code 150 is set equal to the addition of the previous value of tuning code 150 and the value of $2^n$. Assuming tuning code 150 has 4 bits and n is equal to 4, during the first iteration through tuning method 300, tuning code 150 is set equal to a value of 8 at step 340, which corresponds to the median value of tuning code 150. After updating tuning code 150 at step 340, tuning method 300 proceeds to step 350.

At step 350 a decision is made based on a comparison between the current measured capacitance ($C_{MEAS}$) 170 and reference capacitance ($C_{REF}$) 180. The current value of measured capacitance 170 is based on tuning code 150 being equal to its median value. If measured capacitance 170 is less than reference capacitance 180, the lower half of the values associated with tuning code 150 will be disregarded and searched no further, and if the measured capacitance 170 is greater than reference capacitance 180, the upper half of the values associated with tuning code 150 will be disregarded and searched no further. In the exemplary instance of tuning code 150 comprising 4-bits, the lower half of the values associated with tuning code 150 are values 1-7, and the upper half of the values associated with tuning code 150 are values 9-15.

If measured capacitance 170 is less than reference capacitance 180, tuning method 300 proceeds to step 360, where tuning code 150 is set equal to the difference between the current value of tuning code 150 and the value of $2^n$. After step 360 completes, tuning method 300 proceeds to step 370. On the other hand, if measured capacitance 170 is greater than reference capacitance 180, tuning method 300 proceeds directly to step 370 from step 350.

At step 370 a decision is made based on weather the current value of the variable n is equal to 0. If the variable n is equal to 0, tuning method 300 ends at step 380. If the variable n is not equal to 0, tuning method 300 returns to step 330 and repeats the above mentioned steps until n is equal to 0. Once n is equal to 0 and tuning method 300 ends, the current value of tuning code 150 is the tuning code that results in measured capacitance 170 being as closely matched as possible to reference capacitance 180.

2. TUNABLE CAPACITIVE ARRAY DESIGN AND LAYOUT

FIG. 4 illustrates an exemplary implementation of a 4-bit tunable capacitive array 400, according to embodiments of the present invention. Tunable capacitive array 400 is used throughout the description below as an exemplary tunable capacitive array in which embodiments of the present invention can be implemented. However, as will be appreciated by one of ordinary skill in the art, many different sizes and/or configurations of tunable capacitive arrays can be used without departing from the scope and spirit of the present invention.

As illustrated in FIG. 4, 4-bit tunable capacitive array 400 includes 4 switches, $S_1$-$S_4$, and 4 capacitors, $C_1$-$C_4$. In an embodiment, capacitors $C_1$-$C_4$ are scaled in a binary fashion, with $C_1$ having the smallest capacitance and $C_4$ having the largest capacitance. Switches $S_1$-$S_4$ are respectively coupled to the 4 tuning code bits, $TC_1$-$TC_4$, of tuning code 410 such that the expected capacitance, provided by 4-bit tunable capacitive array 400, across capacitive nodes 420, increases and decreases with the value of 4-bit tuning code 410. In other words, ideally, as tuning code 410 increases, the expected capacitance provided by 4-bit tunable capacitive array 400 increases, and as tuning code 410 decreases, the expected capacitance provided by 4-bit tunable capacitive array 400 decreases.

FIG. 5 illustrates an exemplary IC capacitor layout 500 of the 4, binary scaled capacitors $C_1$-$C_4$ of FIG. 4. Layout 500 illustrates that each capacitor $C_1$-$C_4$ has been implemented as a lump capacitor. A lump capacitor refers to a capacitor that has been constructed from a single, physical, capacitive structure. In other words, a lump capacitor is not constructed from a plurality of smaller, distributed capacitive structures, that are coupled together, in parallel, to make a larger capacitor.

As illustrated in FIG. 5, capacitors $C_1$-$C_4$ have been specifically implemented as fringe capacitors. Each fringe capacitor is implemented using two, interdigitated metal portions that can reside on a semiconductor substrate. It should be noted, however, that many different capacitive structures can be used without departing from the scope and spirit of the present invention. For example, capacitors $C_1$-$C_4$ can be implemented using: stacked parallel fringe capacitors, poly-diffusion, poly-poly, or metal-poly structures to name a few.

As noted above, capacitors $C_1$-$C_4$ are scaled in a binary fashion, with capacitor $C_1$ being the smallest valued capacitor and capacitor $C_4$ being the largest valued capacitor. Assuming the combined parallel capacitance of capacitors $C_1$-$C_4$ is equal to X farads, tunable capacitive array 400 has a full scale output range (FSR) of X farads, with capacitor $C_1$ having an expected capacitance equal to $1/16$ of the FSR, capacitor $C_2$ having an expected capacitance equal to $2/16$ of the FSR, capacitor $C_3$ having an expected capacitance equal to $4/16$ of the FSR, and capacitor $C_4$ having an expected capacitance equal to $8/16$ of the FSR. A tuning module, such as tuning module 110 of FIG. 1, can step through each parallel combination of capacitors $C_1$-$C_4$ to provide $2^4$ or 16 different capacitive values.

FIG. 6 illustrates a plot 600 of the expected or ideal transfer function of tunable capacitive array 400 implementing the 4 lump capacitors, $C_1$-$C_4$, illustrated in FIG. 5. In other words, plot 600 illustrates the ideal capacitive output for tunable capacitive array 400 implementing the 4 lump capacitors, $C_1$-$C_4$, illustrated in FIG. 5, for each value of 4-bit tuning code 410.

The horizontal axis of plot 600 lists each of the 16 binary values of 4-bit tuning code 410. The vertical axis of plot 600 lists the measured capacitance ($C_{MEAS}$) provided by 4-bit tunable capacitive array 400 across capacitive nodes 420. As illustrated in FIG. 6, the ideal transfer function 610 is monotonically increasing and each 1-bit increase in tuning code 410 corresponds to an increase of $1/16$ of the full scale output range (FSR). In more general terms, the code-to-code transition points of tuning code 410 are ideally separated by FSR/$2^N$, where N is the number of bits in tuning code 410.

In practical implementations, however, each lump capacitor $C_1$-$C_4$ has an associated tolerance; that is, a maximum variation from its expected capacitance value. Specifically, process variations, associated with the manufacture of ICs, can create mismatches between the expected capacitance and measured capacitance of a capacitive structure implemented in an IC. For example, lump capacitors $C_1$-$C_4$, illustrated in FIG. 5, can have measured capacitances greater than or less than their expected capacitances due to process variations. In fact, each lump capacitor $C_1$-$C_4$ can have different associated errors; for example, lump capacitor $C_1$ can have a measured capacitance 4% below its expected capacitance, whereas lump capacitor $C_4$ can have a measured capacitance 2.8% above its expected capacitance. The error associated with each capacitive structure implemented using a typical IC process is, in general, defined by a random process.

FIG. 7 illustrates an exemplary plot 700 of a typical transfer function of tunable capacitive array 400 implementing the 4 lump capacitors, $C_1$-$C_4$, illustrated in FIG. 5. In other words, plot 700 illustrates typical capacitive outputs for tunable capacitive array 400 implementing the 4 lump capacitors, $C_1$-$C_4$, illustrated in FIG. 5. The horizontal axis of plot 700 lists each of the 16 binary values of 4-bit tuning code 410. The vertical axis of plot 700 lists the measured capacitance ($C_{MEAS}$) provided by 4-bit tunable capacitive array 400 across capacitive nodes 420.

Because of random errors in the value of capacitance provided by each lump capacitor $C_1$-$C_4$, the measured capacitance for each value of tuning code 410 deviates from the ideal transfer function 710. For example, from plot 700 it can be seen that the smallest lump capacitor $C_1$ has a measured capacitance less than its expected capacitance. This can be seen from the measured output capacitance at tuning code "0001", where the measured output capacitance is slightly less than ideal transfer function 710. Similarly, from plot 700 it can be seen that the second smallest lump capacitor $C_2$ has a measured capacitance greater than its expected capacitance. This can be seen from the measured output capacitance at tuning code "0010", where the measured output capacitance is considerably greater than ideal transfer function 710.

The non-linearity of the typical transfer function, illustrated by plot 700, can be quantified by its differential non-linearity (DNL). DNL is defined as the deviation between two adjacent output points from the ideal 1 LSB step width. It is specifically defined as follows:

$$DNL_n = \frac{C_{n+1} - C_n}{C_{IDEAL-LSB}} - 1$$

where $C_n$ is the measured capacitance corresponding to the tuning code of value n and $C_{IDEAL-LSB}$ is the ideal 1 LSB step width. In the case of tunable capacitive array 400, the ideal 1 LSB step width corresponds to 1/16 of the FSR. To provide an example, a tunable capacitive array that has a 1.5 LSB change in output capacitance for a 1-bit increase in the tuning code has a differential non-linearity error of 0.5 LSB.

In a tunable capacitor, a positive DNL (i.e., a DNL greater than zero) reduces the resolution and accuracy achievable via tuning. Negative DNL makes the transfer function nonlinear and non-monotonic; however, it does not reduce the resolution and accuracy achievable via tuning. In general, the maximum or worst case DNL of a system is typically referred to as the DNL of the system.

To reduce the DNL associated with tunable capacitive array 400, the IC layout of lump capacitors $C_1$-$C_4$ can be modified from IC layout 500, illustrated in FIG. 5. Specifically, FIG. 8 illustrates a conventional IC layout 800 for reducing the DNL associated with lump capacitors $C_1$-$C_4$, illustrated in FIG. 5.

As illustrated in FIG. 8, conventional IC capacitor layout 800 includes 15 unit size capacitors that each have an expected capacitance of 1/16 of the FSR. Specifically, capacitor $C_4$ is comprised of 8 unit size capacitors, capacitor $C_3$ is comprised of 4 unit size capacitors, capacitor $C_2$ is comprised of 2 unit size capacitors, and capacitor $C_1$ is comprised of a single unit size capacitor. In general, each of the unit size capacitors, illustrated in FIG. 8, typically deviates from its expected capacitance value by approximately the same amount. For example, each of the unit size capacitors can deviate from its expected capacitance by approximately 2%. This consistent deviation can be attributed to the same structure used for each capacitor. Because each of the unit size capacitors deviates from its expected capacitance value by a substantially similar amount, it can be shown that a tunable capacitive array implementing the 4 capacitors, $C_1$-$C_4$, illustrated in FIG. 8, will typically have smaller associated differential nonlinearities (DNLs) than a tunable capacitive array implementing the 4 lump capacitors, $C_1$-$C_4$, illustrated in FIG. 5.

Although conventional IC capacitor layout 800 can reduce the DNL, the improvement is not without cost. As further illustrated in FIG. 8, each unit size capacitive structure requires a minimum spacing 810 from other, surrounding unit size capacitive structures. This minimum spacing 810 is generally dictated by the semiconductor process used to fabricate conventional IC capacitor layout 800. In addition, the surrounding metal of each unit capacitor provides only one sided fringe capacitance toward the inside, resulting in an inefficient usage of area. Because many unit size capacitors need to be used, the spacing requirement and related inefficient usage of area contributes to a substantial portion of the area consumed by conventional IC capacitor layout 800. In fact, this additional area can quickly become impractical for larger tunable ranges. In general, area is a precious commodity in many IC designs. Therefore, what is needed is an IC capacitor layout that can provide for improved accuracy within a tunable capacitive array, while limiting any additional area required.

FIG. 9 illustrates a coarse/fine IC capacitor layout 900, according to embodiments of the present invention. Coarse/fine IC capacitor layout 900 can be implemented within a tunable capacitive array, such as tunable capacitive array 400, to provide for improved accuracy over IC capacitor layout 500, illustrated in FIG. 5, while at the same time incurring less additional area than conventional IC capacitor layout 800, illustrated in FIG. 8.

Coarse/fine IC capacitor layout 900, implemented on a semiconductor substrate, includes 4 binary scaled capacitors, $C_1$-$C_4$, and one fine capacitor $C_F$. Each of the binary scaled capacitors $C_1$-$C_4$ and fine capacitor $C_F$ is implemented as a lump capacitor. A lump capacitor refers to a capacitor that has been constructed from a single, physical, capacitive structure. In other words, a lump capacitor is not constructed from a plurality of smaller, distributed capacitive structures, that are coupled together, in parallel, to make a larger capacitor. In general, coarse/fine IC capacitor layout 900 has substantially the same structure as IC capacitor layout 500, illustrated in FIG. 5. However, coarse/fine IC capacitor layout 900 includes an additional fine capacitor $C_F$.

Coarse/fine IC capacitor layout 900 can be used in a tuning scheme that includes two stages; namely, a coarse tuning stage and a fine tuning stage. Specifically, capacitors $C_1$-$C_4$ can be used in the coarse tuning stage and fine capacitor $C_F$ can be used in the fine tuning stage. In general, fine capacitor $C_F$ is used in this bi-stage tuning scheme to "bridge gaps" in the capacitive output provided by a tunable capacitive array, such as tunable capacitive array 400, implementing coarse/fine IC capacitor layout 900. The gaps are associated with differential nonlinearities (DNLs) caused by deviations in the expected capacitance provided by coarse capacitors $C_1$-$C_4$, illustrated in FIG. 9. These gaps particularly occur in transitions from odd to even codes such as "0111" to "1000." FIGS. 10 and 11, described below, illustrate this bi-stage tuning by way of example and the use of fine capacitor $C_F$ in "bridging gaps" to reduce DNLs.

FIG. 10 illustrates an exemplary plot 1000 of a typical transfer function of 4-bit tunable capacitive array 400, illustrated in FIG. 4, implementing the coarse capacitors, $C_1$-$C_4$, illustrated in FIG. 9, according to embodiments of the present invention. The horizontal axis of plot 1000 lists each of the 16 binary values of 4-bit tuning code 410. The vertical axis of plot 1000 lists the measured capacitance ($C_{MEAS}$) provided by 4-bit tunable capacitive array 400 across capacitive nodes 420.

Because of random errors in the value of capacitance provided by each coarse capacitor $C_1$-$C_4$, the measured capacitance for each value of tuning code 410 deviates from the ideal transfer function 1010. For example, from plot 1000 it can be seen that the smallest lump capacitor $C_1$ has a measured capacitance less than its expected capacitance. This can be seen from the measured output capacitance at tuning code "0001", where the measured output capacitance is slightly less than ideal transfer function 1010. Similarly, from plot 1000 it can be seen that the second smallest lump capacitor $C_2$ has a measured capacitance greater than its expected capacitance. This can be seen from the measured output capacitance at tuning code "0010", where the measured output capacitance is considerable greater than ideal transfer function 1010.

FIG. 10 further illustrates a desired or reference capacitance value 1020, marked by an "X" within plot 1000. Desired capacitance value 1020 has an approximate value of 9/16 of the FSR. Tunable capacitive array 400, implementing coarse/fine IC capacitor layout 900, is configured to provide a capacitance across capacitive nodes 420 that accurately matches desired capacitance 1020. In an ideal implementation, tunable capacitive array 400 is capable of matching any desired capacitance value within 1/32 of the FSR. However, because each coarse capacitor $C_1$-$C_4$ has an associated error, the level of accuracy is typically reduced. As illustrated in FIG. 10, no value of tuning code 410 provides an output capacitance that matches desired capacitance 1020 within 1/32 of the FSR. From plot 1000, it can be seen that the value "1001" of tuning code 410 provides a capacitive output that is most closely matched to desired capacitance 1020.

The DNL associated with the transition from tuning code "1001" and "1010" is approximately 1 LSB. In other words, the transition from tuning code "1001" and "1010" corresponds to a change in the capacitive output that is larger than the ideal 1 LSB step width (i.e., 1/16 of the FSR) by approximately 1 LSB. Specifically, the transition from tuning code "1001" to tuning code "1010" corresponds to a change in the capacitive output by 2/16 of the FSR. The 1 LSB DNL, associated with the transition from tuning code "1001" to tuning code "1010", causes a larger gap between the capacitive outputs at these two tuning code values than expected, thereby reducing accuracy. As will be described further below, in regard to FIG. 11, the fine capacitor $C_F$, illustrated in FIG. 9, can be used to bridge this gap between tuning codes "1001" and "1010" to improve accuracy.

FIG. 11 illustrates an exemplary plot 1100 of a typical transfer function of 4-bit tunable capacitive array 400, illustrated in FIG. 4, implementing the coarse capacitors, $C_1$-$C_4$, and fine capacitor $C_F$, illustrated in FIG. 9, according to embodiments of the present invention. The horizontal axis of plot 1100 lists each of the 16 binary values of 4-bit tuning code 410, as well as additional tuning code values that indicate the use of fine capacitor $C_F$. The vertical axis of plot 1100 lists the measured capacitance ($C_{MEAS}$) provided by 4-bit tunable capacitive array 400 across capacitive nodes 420.

FIG. 11 illustrates that after the best "coarse" tuning code is determined, fine capacitor $C_F$, illustrated in FIG. 9, can be used to bridge the gap between the capacitance at that value, thereby reducing the DNL and improving accuracy. Specifically, the square tick marks indicate the capacitive output values of tunable capacitive array 400 with addition of fine capacitor $C_F$. For example, after the circular tick mark indicating the capacitive output at tuning code "0001", the next tick mark is square at the tuning code value "0001_1", where the bit proceeding the underscore indicates the use of fine capacitor $C_F$.

As can be seen from plot 1100, fine capacitor $C_F$ can be used to bridge the DNL gap between tuning codes "1001" and "1010" such that tunable capacitive array 400 can generate a capacitance that more accurately matches desired capacitance 1020. Specifically, tuning code "1001_1" can be used to tune tunable capacitive array 400 to generate a capacitance value that matches desired capacitance 1020 within the expected accuracy of tunable capacitive array 400.

In an embodiment, the number of fine capacitors can be selected based on a worst case positive DNL expected for a tunable capacitive array. The worst case positive DNL typically occurs at a transition of a tuning code, having n-bits, from the tuning code value of $(2^{n-1}-1)$ to the tuning code value of $(2^{n-1})$ and is equal to $2^n * C_{err}$. A 1 LSB unit capacitor is a capacitor having an expected capacitance equal to the 1 LSB step width of the tunable capacitive array and $C_{err}$ is the expected deviation of the 1 LSB unit capacitor.

Assuming, for example, that the worst case positive DNL expected between any two tuning code values is 1.6 LSB, then two additional fine capacitors, each having a capacitive value substantially equal to the 1 LSB step width of the tunable capacitive array, can be utilized to bridge this worst case DNL. In other words, the additional fine capacitors can be selected such that they have a combined capacitance greater than or substantially equal to the equivalent capacitance of the worst case DNL, such that the DNL can be bridged.

It should be noted that many different capacitive values can be used for the fine capacitors to bridge a worst case DNL. For example, assuming a worst case DNL of 2.67 LSBs and fine capacitors of capacitance equal to 0.9 LSB step width, 3 fine capacitors can be utilized to bridge the worst case gap of 2.67 LSBs. In an embodiment, at least one fine capacitor, among a plurality of fine capacitors used in a tunable capacitive array, has a capacitance less than or substantially equal to the capacitance of the 1 LSB step width of the tunable capacitive array.

Moreover, as would be appreciated by one of ordinary skill in the art based on the teachings herein, fine capacitors can be used with any size or scaling of coarse capacitors and are in no way limited to use with binary scaled coarse capacitors.

In an embodiment, a tunable capacitive array, can be implemented to have coarse and fine capacitors in which an expected coarse capacitance change (per one coarse code increment) is larger than a required 1 LSB step width. By utilizing coarse capacitor changes that are larger than the required 1 LSB step width, implementation can be simplified and length of total tuning code can be reduced. Fine capacitors can then be utilized to not only bridge the worst case DNL, associated with the tunable capacitive array implementing the large coarse capacitors, but further to meet the required 1 LSB step width.

3. COARSE/FINE CAPACITIVE TUNING MODULE

FIG. 12 illustrates a modified capacitive tuning system 1200, according to embodiments of the present invention. Modified capacitive tuning system 1200 includes a tuning module 1210, a coarse/fine tunable capacitive array 1220, a capacitive measuring module 1230, and a comparator 1240. Modified capacitive tuning system 1200 can be used within an IC to calibrate a tunable capacitive array that includes both coarse and fine capacitors, such as tunable capacitive array 1220, to provide a capacitance that accurately matches a desired capacitance. The fine capacitors are used to reduce positive DNLs associated with the coarse capacitors.

Tuning module 1210 is coupled to tunable capacitive array 1220 via coarse tuning code 1250 and fine tuning code 1255. Coarse tuning code 1250 includes digital coarse tuning code bits $CTC_1$-$CTC_N$, and fine tuning code 1255 includes digital fine tuning code bits $FTC_1$-$FTC_N$. The value of coarse tuning code 1250 and fine tuning code 1255 is adjusted by tuning module 1210 to vary the capacitance provided by tunable capacitive array 1220. The capacitance provided by tunable capacitive array 1220 is provided across capacitive nodes 1260, which includes nodes $CN_1$ and $CN_2$. In an embodiment, tunable capacitive array 1220 is designed to provide increasing values of capacitance across capacitive nodes 1260 for increasing values of coarse tuning code 1250 and/or fine tuning code 1255.

Capacitive measuring module 1230 is coupled to tunable capacitive array 1220 via capacitive nodes 1260. Capacitive measuring module 1230 is configured to measure the actual capacitance provided by tunable capacitive array 1220 across capacitive nodes 1260. The measured capacitance ($C_{MEAS}$) 1270 is provided at an output of capacitive measuring module 1230 to comparator 1240. In an embodiment, measured capacitance 1270 is provided as a voltage signal.

Comparator 1240 receives measured capacitance 1270 at an input and compares measured capacitance 1270 to a reference capacitance value ($C_{REF}$) 1280. In an embodiment, comparator 1240 determines if measured capacitance 1270 is less than reference capacitance value 1280. In general, reference capacitance value 1280 represents a desired capacitance value. Tuning module 1210 can receive the comparison result 1290 to adjust the capacitance provided by tunable capacitive array 1220 to better match reference capacitance value 1280. Specifically, if comparison result 1290 indicates that measured capacitance 1270 is less than reference capacitance value 1280, coarse tuning code 1250 and/or fine tuning code 1255 can be increased to adjust tunable capacitive array 1220 to provide a larger capacitance. If comparison result 1290 indicates that measured capacitance 1270 is greater than reference capacitance value 1280, coarse tuning code 1250 and/or fine tuning code 1255 can be decreased to adjust tunable capacitive array 1220 to provide a smaller capacitance. In this way, capacitive tuning system 1200 can determine a tuning code that provides a capacitance across capacitive nodes 1260 that most accurately matches reference capacitance 1280. It should be noted that any desired tuning method can be implemented within tuning module 1210 for adjusting coarse tuning code 1250 and/or fine tuning code 1255 based on comparison result 1290. One exemplary tuning method is described in detail below in regard to FIGS. 14 and 15.

FIG. 13 illustrates an exemplary implementation of coarse/fine tunable capacitive array 1220, illustrated in FIG. 12, according to embodiments of the present invention. Tunable capacitive array 1220 includes coarse switches $CS_1$-$CS_N$, fine switches $FS_1$-$FS_N$, scaled coarse capacitors $CC_1$-$CC_N$, and fine capacitors $FC_1$-$FC_N$.

Scaled coarse capacitors $CC_1$-$CC_N$ and fine capacitors $FC_1$-$FC_N$ are respectively coupled/decoupled across capacitive nodes 1260 by coarse switches $CS_1$-$CS_N$ and fine switches $FS_1$-$FS_N$. For example, coarse switch $CS_1$ couples/decouples coarse capacitor $CC_1$ across capacitive nodes 160. Specifically, if coarse switch $CS_1$ is closed, coarse capacitor $CC_1$ is coupled across capacitive nodes 160, and if coarse switch $CS_1$ is open, coarse capacitor $CC_1$ is decoupled across capacitive nodes 160.

In an embodiment, scaled coarse capacitors $CC_1$-$CC_N$ increase in capacitance from coarse capacitor $CC_1$ to $CC_N$ in a binary fashion; that is, the expected capacitance of each scaled coarse capacitor $CC_1$-$CC_N$ doubles in relation to the capacitance that it immediately succeeds. Binary scaling of coarse capacitors $CC_1$-$CC_N$ provides for $2^N$ different expected coarse capacitance values that can be provided across capacitive nodes 1260. Each of the $2^N$ different expected coarse capacitance values corresponds to a different on/off configuration of coarse switches $CS_1$-$CS_N$.

As further illustrated in FIG. 13, each coarse switch $CS_1$-$CS_N$ is controlled by a respective bit of coarse tuning code 1250, and each fine switch $FS_1$-$FS_N$ is controlled by a respective bit of fine tuning code 1255. Specifically, coarse switch $CS_1$ is controlled by the least significant bit, $CTC_1$, of coarse tuning code 1250, coarse switch $CS_2$ is controlled by the second least significant bit, $CTC_2$, of coarse tuning code 1250, and, continuing this pattern all the way through, coarse switch $CS_N$ is controlled by the most significant bit, $CTC_N$, of coarse tuning code 1250. Fine switches $FS_1$-$FS_N$ are controlled in a similar manner, as coarse switches $CS_1$-$CS_N$, by fine tuning code 1255. This particular coupling of coarse tuning code 1250 to coarse switches $CS_1$-$CS_N$ and fine tuning code 1255 to fine switches $FS_1$-$FS_N$ allows for the expected capacitance, provided by tunable capacitive array 1200 across capacitive nodes 1260, to increase and decrease with the value of coarse and fine tuning codes 1250 and 1255. In other words, as coarse tuning code 1250 and/or fine tuning code 1255 increases, the expected capacitance provided by tunable capacitive array 1200 increases and as coarse tuning code 1250 and/or fine tuning code 1255 decreases, the expected capacitance provided by tunable capacitive array 1200 decreases.

4. COARSE/FINE TUNING METHOD

FIG. 14 illustrates an exemplary coarse tuning method 1400 that can be implemented by tuning module 1210 of FIG. 12, according to embodiments of the present invention. Coarse tuning method 1400 is configured to perform a binary search over the values of coarse tuning code 1250 to determine the specific value of coarse tuning code 1250 that results in measured capacitance 1270 being as closely matched as possible to reference capacitance 1280. After coarse tuning is performed by method 1400, fine tuning can proceed.

The binary search is performed by starting with the median value of coarse tuning code 1250 and comparing measured capacitance 1270 with reference capacitance 1280. Based on the comparison result, half of the values associated with coarse tuning code 1250 can be disregarded. Specifically, if measured capacitance 1270 is less than reference capacitance 1280, the lower half of the values associated with coarse tuning code 1250 can be disregarded and searched no further. This is simply because if the median value of coarse tuning code 1250 results in a measured capacitance 1270 that is less than reference capacitance 1280, all values of tuning code 1250 below the median value of coarse tuning code 1250 will similarly result in (or are expected to result in) a measured capacitance 1270 that is less than reference capacitance 1280. In the alternative, if measured capacitance 1270 is greater than reference capacitance 1280, the upper half of the values associated with coarse tuning code 1250 can be disregarded and searched no further. The process of selecting the median value of coarse tuning code 1250 and disregarding half of the values associated with coarse tuning code 1250 can be repeated for the remaining values of coarse tuning code 1250 until the value of coarse tuning code 1250 that results in measured capacitance 1270 being as closely matched as possible to reference capacitance 1280 is found. Tuning method 1400 is described in further detail below with reference to FIG. 14.

Coarse tuning method 1400 starts at step 1410 and immediately proceeds to step 1420. At step 1420 the value of coarse tuning code 1250, denoted by CTC in FIG. 14, is initialized to 0 and variable n is initialized to the integer value N, which is equal to the number of digital bits used to represent coarse tuning code 1250. For explanation purposes, N will be assumed to be equal to 4, resulting in $2^4$ or 16 possible values of tuning code 1250. The variable n is used throughout the execution of method 1400 to iterate through the values represented by each bit of coarse tuning code 1250 (i.e., 8, 4, 2, and 1). In addition, at step 1420, the value of fine tuning code 1255 and the variable m are further initialized to 0. After initialization at step 1420, coarse tuning method 1400 proceeds to step 1430.

At step 1430, the value of n is decremented by 1 and coarse tuning method 1400 proceeds to step 1440. At step 1440, the current value of coarse tuning code 1250 is set equal to the addition of the previous value of coarse tuning code 1250 and the value of $2^n$. Assuming coarse tuning code 1250 has 4-bits and n is equal to 4, during the first iteration through coarse tuning method 1400, coarse tuning code 1250 is set equal to a value of 8 at step 1440, which corresponds to the median value of coarse tuning code 1250. After updating coarse tuning code 1250 at step 1440, coarse tuning method 1400 proceeds to step 1450.

At step 1450 a decision is made based on a comparison between the current measured capacitance ($C_{MEAS}$) 1270 and reference capacitance ($C_{REF}$) 1280. The current value of measured capacitance 1270 is based on coarse tuning code 1250 being equal to its median value. If measured capacitance 1270 is less than reference capacitance 1280, the lower half of the values associated with coarse tuning code 1250 will be disregarded and searched no further, and if the measured capacitance 1270 is greater than reference capacitance 1280, the upper half of the values associated with coarse tuning code 1250 will be disregarded and searched no further. In the exemplary instance of coarse tuning code 1250 comprising 4-bits, the lower half of the values associated with coarse tuning code 1250 are values 1-7, and the upper half of the values associated with coarse tuning code 1250 are values 9-15.

If measured capacitance 1270 is less than reference capacitance 1280, coarse tuning method 1400 proceeds to step 1460, where the variable ODD is set equal to 0. The variable ODD is used during fine tuning to determine whether the smallest coarse capacitor has been used. In general, if the smallest coarse capacitance has not been used, as indicated by the variable ODD, it can be determined that fine tuning may not produce any further benefit. Therefore, when the variable ODD is set equal 0, fine tuning may not be conducted. After step 1460 completes, coarse tuning method 1400 proceeds to step 1480. At step 1480, coarse tuning code 1250 is set equal to the difference between the current value of coarse tuning code 1250 and the value of $2^n$.

On the other hand, if measured capacitance 1270 is greater than reference capacitance 1280, tuning method 1400 proceeds to step 1470 from step 1450. At step 1470, the variable ODD is set equal to 1 and coarse tuning method 1400 proceeds to step 1480.

At step 1480 a decision is made based on weather the current value of the variable n is equal to 0. If the variable n is equal to 0, coarse tuning method 1400 ends at step 1490. If the variable n is not equal to 0, coarse tuning method 1400 returns to step 1430 and repeats the above mentioned steps until n is equal to 0. Once n is equal to 0 and coarse tuning method 1400 ends, the current value of coarse tuning code 1250 is the coarse tuning code that results in measured capacitance 1270 being as closely matched as possible to reference capacitance 1280 using the available coarse capacitors. After coarse tuning method 1400 has completed, fine tuning method 1500, illustrated in FIG. 15, is performed FIG. 15 illustrates an exemplary fine tuning method 1500 that can be implemented by tuning module 1210 of FIG. 12, according to embodiments of the present invention. Fine tuning method 1500 is configured to perform a sequential search over the values of fine tuning code 1255 to determine the specific value of fine tuning code 1255 that results in measured capacitance 1270 being as closely matched as possible to reference capacitance 1280. Fine tuning attempts to add fine capacitors $FC_1$-$FC_N$ to the parallel combination of coarse capacitors $CC_1$-$CC_N$, determined during coarse tuning method 1400, to more accurately match reference capacitance 1280.

Fine tuning method 1500 begins at step 1510, where a decision is made based on weather the current value of the variable ODD is equal to 1. As noted above, in regard to coarse tuning method 1400, the variable ODD indicates whether the smallest coarse capacitor has been utilized by the coarse tuning code determined to best match reference capacitance 1280. If ODD is not equal to 1, the smallest coarse capacitor has not been utilized and fine tuning method 1500 proceeds to step 1560 and ends. However, if ODD is equal to 1, the smallest coarse capacitor has been utilized and fine tuning method 1500 proceeds to step 1520.

At step 1520, another decision is made regarding whether measured capacitance ($C_{MEAS}$) 1270 is less than reference capacitance ($C_{REF}$) 1280. If measured capacitance 1270 is less than reference capacitance 1280, fine tuning method 1500 proceeds to step 1530. If measured capacitance 1270 is greater than reference capacitance 1280, fine tuning method 1500 proceeds to step 1560 and ends.

At step 1530, fine tuning code 1255 is incremented by 1, and fine tuning method 1500 proceeds to step 1540.

At step 1540, the variable m is incremented by 1, and fine tuning method 1500 proceeds to step 1550.

At step 1550, a decision is made regarding whether variable m is less than constant value M representing the total number of fine capacitors available. If the variable m is less than constant value M, unused fine capacitors remain, and fine tuning method 1500 returns to step 1520 to repeat the above mentioned steps until the variable m is less than constant value M or measured capacitance 1270 is greater than reference capacitance 1280. If the variable m is not less than constant value M, fine tuning method 1500 proceeds to step 1560 and ends. After fine tuning method 1500 has completed, the current value of fine tuning code 1255 is the fine tuning code that results in measured capacitance 1270 being as closely matched as possible to reference capacitance 1280 for a give coarse tuning code.

5. CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A capacitive tuning system, comprising:
   a tuning module configured to generate a coarse tuning code and a fine tuning code; and
   a tunable capacitive array implemented on a semiconductor substrate, the tunable capacitive array comprising:
      scaled coarse capacitors configured to provide a coarse capacitance based on the coarse tuning code, wherein each scaled coarse capacitor is a lump capacitor; and
      one or more fine capacitors configured to provide a fine capacitance based on the fine tuning code to reduce a differential nonlinearity associated with the scaled coarse capacitors,
      wherein a number of the one or more fine capacitors utilized by the tunable capacitive array is determined based on the differential nonlinearity associated with the scaled coarse capacitors.

2. The capacitive tuning system of claim 1, wherein the coarse capacitance and the fine capacitance are combined in parallel.

3. The capacitive tuning system of claim 1, wherein the scaled coarse capacitors are binary scaled.

4. The capacitive tuning system of claim 1, wherein the coarse tuning code comprises N bits configured to provide $2^N$ different values.

5. The capacitive tuning system of claim 4, wherein the tunable capacitive array is configured to provide a change in the coarse capacitance for an increase in the coarse tuning code by a value of one.

6. The capacitive tuning system of claim 5, wherein a capacitance provided by at least one of the one or more fine capacitors is less than or substantially equal to the change in the coarse capacitance for an increase in the coarse tuning code by a value of one.

7. The capacitive tuning system of claim 1, wherein the tuning module is configured to generate the coarse tuning code based on comparisons of the coarse capacitance to a reference capacitance.

8. The capacitive tuning system of claim 7, wherein the tuning module is configured to generate the coarse tuning code before generating the fine tuning code.

9. A capacitive tuning system, comprising:
   a tuning module configured to generate a coarse tuning code and a fine tuning code; and
   a tunable capacitive array implemented on a semiconductor substrate, the tunable capacitive array comprising:
      scaled coarse capacitors configured to provide a coarse capacitance based on the coarse tuning code, wherein each scaled coarse capacitor is a lump capacitor; and
      one or more fine capacitors configured to provide a fine capacitance based on the fine tuning code to reduce a differential nonlinearity associated with the scaled coarse capacitors,
      wherein the fine capacitance is combined in parallel with the coarse capacitance only for odd values of the coarse tuning code.

10. A capacitive tuning system, comprising:
    a tuning module configured to generate a coarse tuning code and a fine tuning code; and
    a tunable capacitive array implemented on a semiconductor substrate, the tunable capacitive array comprising:
       scaled coarse capacitors configured to provide a coarse capacitance based on the coarse tuning code, wherein each scaled coarse capacitor is a lump capacitor; and
       one or more fine capacitors configured to provide a fine capacitance based on the fine tuning code to reduce a differential nonlinearity associated with the scaled coarse capacitors,
       wherein a number of the one or more fine capacitors included in the tunable capacitive array is determined based on the differential nonlinearity associated with the scaled coarse capacitors,
       wherein the tunable capacitive array is configured to provide a change in the coarse capacitance for an increase in the coarse tuning code by a value of one,
       wherein a capacitance provided by at least one of the one or more fine capacitors is less than or substantially equal to the change in the coarse capacitance.

11. The capacitive tuning system of claim 10, wherein the tuning module is configured to generate the coarse tuning code based on comparisons of the coarse capacitance to a reference capacitance.

12. The capacitive tuning system of claim 11, wherein the tuning module is configured to generate the coarse tuning code before generating the fine tuning code.

13. The capacitive tuning system of claim 10, wherein the coarse capacitance and the fine capacitance are combined in parallel.

14. The capacitive tuning system of claim 10, wherein the fine capacitance is combined with the coarse capacitance only for odd values of the coarse tuning code.

15. The capacitive tuning system of claim 10, wherein the coarse tuning code comprises N bits configured to provide $2^N$ different values.

16. The capacitive tuning system of claim 10, wherein the scaled coarse capacitors are binary scaled.

17. The capacitive tuning system of claim 10, further comprising:
    a capacitive measuring module configured to measure a capacitance provided by the tunable capacitive array to provide a measured capacitance.

18. The capacitive tuning system of claim 17, further comprising:
    a comparator configured to compare the measured capacitance to a reference capacitance value to generate a comparison result.

19. The capacitive tuning system of claim 18, wherein the tuning module is configured to generate the coarse tuning code and the fine tuning code based on the comparison result.

* * * * *